United States Patent [19]

Lur et al.

[11] Patent Number: 5,364,803

[45] Date of Patent: Nov. 15, 1994

[54] METHOD OF PREVENTING FLUORINE-INDUCED GATE OXIDE DEGRADATION IN $WSI_x$ POLYCIDE STRUCTURE

[75] Inventors: Water Lur, Taipei; Cheng-Han Huang, Hsin-Chu, both of

[73] Assignee: United Microelectronics Corporation, Hsinchu,

[21] Appl. No.: 80,304

[22] Filed: Jun. 24, 1993

[51] Int. Cl.$^5$ .......................................... H01L 21/265
[52] U.S. Cl. ...................................... 437/40; 437/200;
437/190; 437/192; 437/193; 437/247
[58] Field of Search ................. 437/190, 200, 40, 192,
437/193, 247

[56] References Cited

U.S. PATENT DOCUMENTS 4,640,004  2/1987  Thomas et al. ........................ 437/200
4,962,414  10/1990  Liou et al. ............................. 437/190

OTHER PUBLICATIONS

Hsu et al., "Direct Evidence of Gate Oxide Thickness Increase in Tungsten Polycide Processes", IEEE Elec. Dev. Lett., vol. 12, No. 11, Nov. 1991, pp. 623–625.

Primary Examiner—Brian E. Hearn
Assistant Examiner—Tuan Nguyen
Attorney, Agent, or Firm—George O. Saile

[57] ABSTRACT

A new method of fabricating a polycide gate structure is described. A gate polysilicon layer is provided overlying a gate oxide layer on the surface of a semiconductor substrate. A thin conducting diffusion barrier layer is deposited overlying the gate polysilicon layer. A layer of tungsten silicide is deposited overlying the thin conducting diffusion barrier layer wherein a reaction gas used in the deposition contains fluorine atoms and wherein the fluorine atoms are incorporated into the tungsten silicide layer. The gate polysilicon, thin conducting diffusion barrier, and tungsten silicide layers are patterned to form the polycide gate structures. The wafer is annealed to complete formation of the polycide gate structures wherein the number of fluorine atoms from the tungsten silicide layer diffusing into the gate polysilicon layer are minimized by the presence of the thin conducting diffusion barrier layer and wherein because the diffusion of the fluorine atoms is minimized, the thickness of the gate oxide layer does not increase. This prevents the device from degradation such as threshold voltage shift and saturation current decrease.

9 Claims, 2 Drawing Sheets

METHOD OF PREVENTING FLUORINE-INDUCED GATE OXIDE DEGRADATION IN WSI$_x$ POLYCIDE STRUCTURE

BACKGROUND OF THE INVENTION

1. Field of the Invention

The invention relates to a method of fabricating a polycide gate structure, and more particularly, to a method of fabricating a polycide gate structure while preventing fluorine-induced gate oxide degradation in the manufacture of integrated circuits.

2. Description of the Prior Art

Low pressure chemical vapor deposited (LPCVD) tungsten silicide (WSi$x$) has been widely used in the polycide gate structure. WFe and SiH4 are the main reaction gases. A large number of fluorine atoms are incorporated into the tungsten silicide layer during the deposition process. The paper, "Direct Evidence of Gate Oxide Thickness Increase In Tungsten Polycide Processes" by S. L. Hsu et al, IEEE Electron Device Letters, Vol. 12, No. 11, November 1991, pp. 623–625, shows that the fluorine atoms "diffused from tungsten silicide films to gate oxides causes additional growth." This additional gate oxide will cause device degradation such as a shift in threshold voltage and a descrease in saturation current.

SUMMARY OF THE INVENTION

A principal object of the present invention is to provide an effective and very manufacturable method of preventing fluorine-induced gate oxide degradation in The fabrication of a polycide gate structure.

In accordance with the object of this invention a new method of fabricating a polycide gate structure is achieved. A gate polysilicon layer is provided overlying a gate oxide layer on the surface of a semiconductor substrate. A thin conducting diffusion barrier layer is deposited overlying the gate polysilicon layer, A layer of tungsten silicide is deposited overlying the thin conducting diffusion barrier layer wherein a reaction gas used in the deposition contains fluorine atoms and wherein the fluorine atoms are incorporated into the tungsten silicide layer. The gate polysilicon, thin conducting diffusion barrier, and tungsten silicide layers are patterned to form the polycide gate structures. The wafer is annealed to complete formation of the polycide gate structures wherein the number of fluorine atoms from the tungsten silicide layer diffusing into the gate polysilicon layer are minimized by the presence of the thin conducting diffusion barrier layer and wherein because the diffusion of the fluorine atoms is minimized, the thickness of the gate oxide layer does not increase. This prevents the device from degradation such as threshold voltage shift and saturation current descrease.

BRIEF DESCRIPTION OF THE DRAWINGS

In the accompanying drawings forming a material part of this description, there is shown.

DESCRIPTION OF THE PREFERRED EMBODIMENTS

Figure 1:
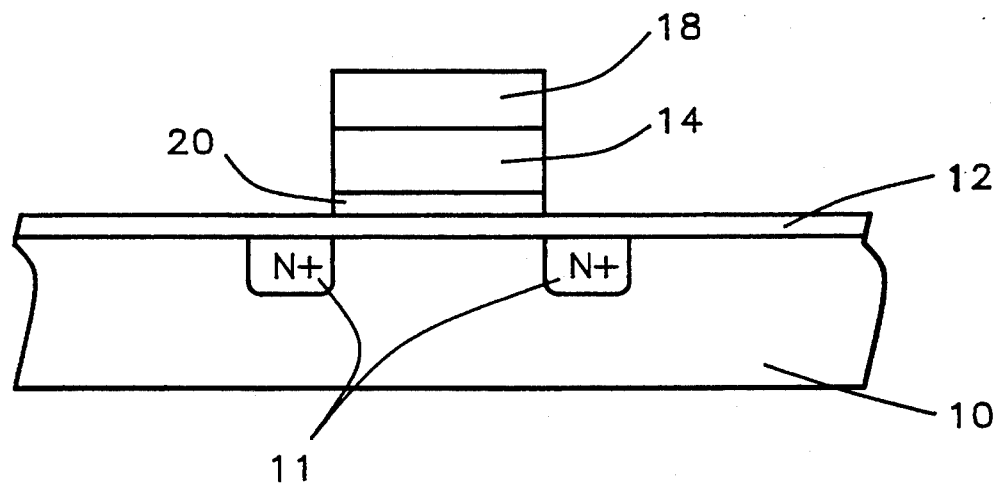
FIG. 1 schematically illustrates in cross-sectional representation an embodiment of the prior art.

Referring now more particularly to FIG. 1, there is illustrated a portion of a partially complete integrated circuit. There is shown a semiconductor substrate 10, preferably composed of monocrystalline silicon. Source/drain regions 11 are formed as is understood in the art either before or after formation of the gate structure. Gate silicon oxide layer 12 is deposited over the surface of the substrate 10. Typically, the gate oxide thickness between about 40 to 400 Angstroms. Next, the gate polysilicon layer 14 is deposited over the gate oxide layer. The thickness of the polysilicon layer is between about 800 to 4000 Angstroms.

To complete the polycide gate structure, a layer of tungsten silicide 18 is deposited by low pressure chemical vapor deposition (LPCVD) to a thickness of between about 800 to 4000 Angstroms. Using conventional photolithography and etching techniques, the layers 14 and 18 are patterned to form the desired polycide gate electrodes. In the silicon gate process as is understood in the art, the source/drain regions 11 are formed by ion implantation of, for example N+ impurities, such as phosphorus or arsenic ions. After the source/drain regions and gate electrode patterns have been defined, the wafer is annealed.

WF$_6$ and SiH$_4$ are the main reaction gases in the deposition of tungsten silicide layer 18. A large number of fluorine atoms are incorporated into the tungsten silicide layer. When the polycide structure is annealed at high temperatures, fluorine atoms diffuse from the tungsten silicide through the polysilicon 14 to the gate oxide 12. The fluorine atoms react with the oxide and break the Si-O bonds by replacing oxygen at those sites. The released oxygen diffuses to the interface and oxidizes the sillcon and polysilicon resulting in additional oxide thickness 20.

Figure 2:
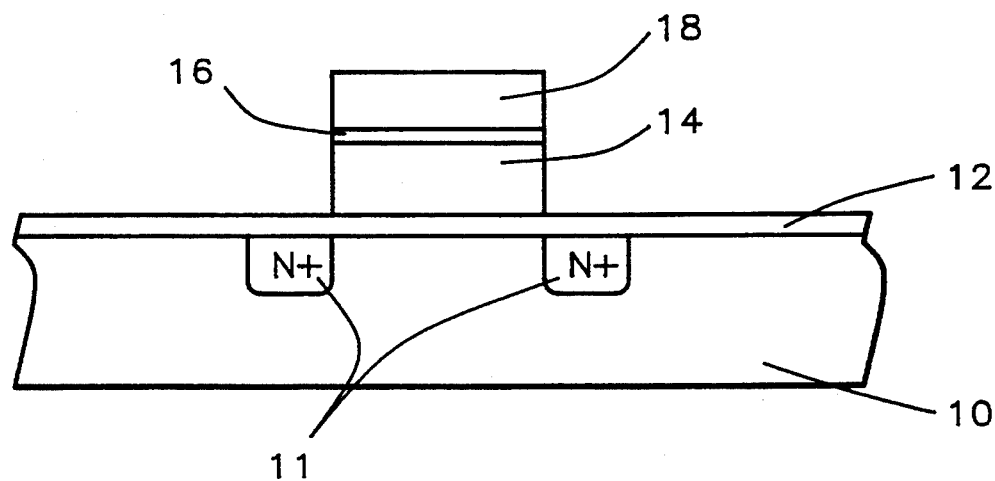
FIG. 2 schematically illustrates in cross-sectional representation one preferred embodiment of the present invention.

Referring now to FIG. 2, the process of the present invention will be described. Processing begins as described above in the prior art process. Gate oxide layer 12 is deposited on the surface of the monocrystalline semiconductor substrate 10. The gate oxide thickness is between about 40 to 400 Angstroms. Next, the gate polysilicon layer 14 is deposited over the gate oxide layer, The thickness of the polysilicon layer is between about 800 to 4000 Angstroms.

A thin conducting diffusion barrier layer 16 is introduced between the polysilicon and tungsten silicide layers to minimize the diffusion of fluorine atoms from the tungsten silicide to the gate oxide layer. Reactive sputtered titanium nitride (TiN$_x$) is the preferred barrier material. It has a preferred thickness of between about 150 to 1500 Angstroms. N$_2$ is fed into the sputter chamber with a titanium target. The sputtered titanium atoms react with the N$_2$ to form TiN$_x$ on the silicon wafer. Other conductive barrier layers for the diffusion barrier layer are titanium tungsten (TiW) or tantalum nitride (TAN) which are sputtered in the similar way as the titanium nitride.

After deposition of the diffusion barrier layer 16, a layer of tungsten silicide 18 is deposited by low pressure chemical vapor deposition (LPCVD) to a thickness of between about 800 to 4000 Angstroms. Using conventional photolithography and etching techniques, the layers 14, 16, and 18 are patterned to form the desired polycide gate electrodes. After the gate electrode patterns have been defined, the source/drain regions 11 are formed by ion implantation of, for example N+ impurities, such as phosphorus or arsenic ions. The wafer is annealed, normally at a temperature of between about 800° to 1050° C. in the ambient of $N_2$ and $O_2$ for about 10 to 60 minutes.

The barrier diffusion layer 16 minimizes the diffusion of fluorine atoms from the tungsten silicide layer into the polysilicon and gate oxide layers. The gate silicon oxide thickness is not increased after annealing as in the prior art. Low resistance and low stress are maintained and high temperature stability is achieved by the process of the present invention along with no degradation of the device.

The integrated circuit is completed as is conventional in the art.

The following Examples are given to show the important features of the invention and to aid in the understanding thereof and variations may be made by one skilled in the art without departing from the spirit and scope of the invention.

EXAMPLES 1–4

Table I shows the gate structure and resulting gate oxide thickness for example 1, as deposited, and for examples 2, 3, and 4 after annealing at 1000° C. for 40 minutes in an oxygen atmosphere of 10 standard liters per minute.

TABLE I

| EXAMPLE | structure WSix/TiNx/Poly-Si | RTP of TiNx 750° C., 20 sec | gate oxide thickness |
|---|---|---|---|
| 1 | 2000/0/2000 A | — | 212 A |
| 2 | 2000/0/2000 A | — | 222 A |
| 3 | 1400/600/2000 A | No | 217 A |
| 4 | 1400/600/2000 A | Yes | 212 A |

Example 1 shows the as-deposited thicknesses of the polycide gate structure and the gate oxide. Example 2 used the conventional process of the prior art. After annealing, the gate oxide thickness had increased by 10 Angstroms. (Note that transmission electron microscopy (TEM) was used to measure thicknesses. There is an error of +/−3 Angstroms). Examples 3 and 4 used the process of the invention wherein a diffusion barrier of titanium nitride was used with a thickness of 600 Angstroms. Where a rapid thermal process (RTP) was used for the TiNx layer, the gate oxide thickness was unchanged from the as-deposited thickness in Example 1.

Figure 3:
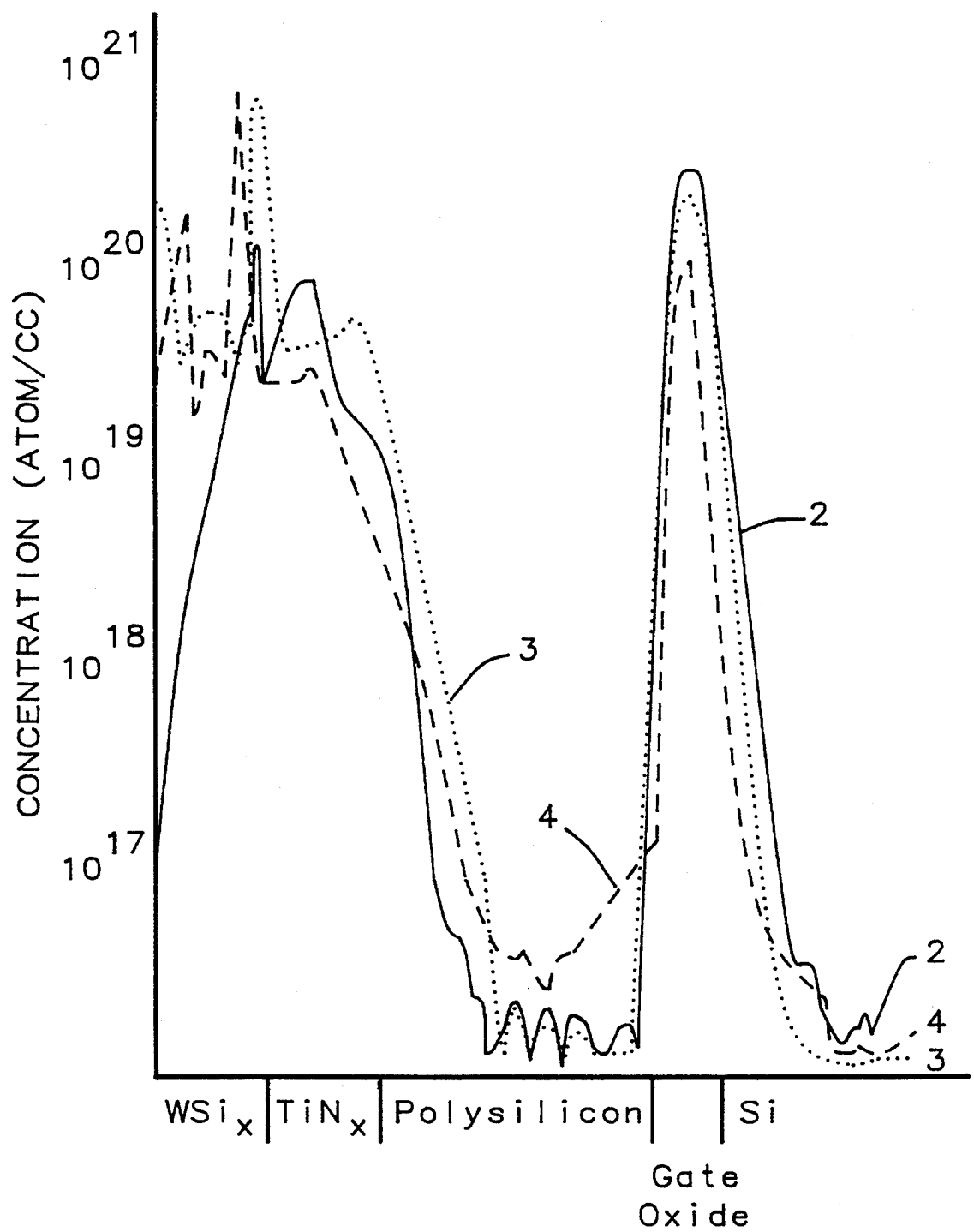
FIG. 3 illustrates in graphical representation the fluorine atom concentration at increasing depths of the polycide gate structure.

Referring now to FIG. 3, there is shown the SIMS analysis of the fluorine concentration in atoms per cubic centimeter at increasing depths of the gate electrode structure for the three examples 2, 3, and 4 from Table I above. The layers of the gate structure are identified on the x-axis of the graph. It can be seen that the highest and most broad fluorine peak in the gate oxide was observed in example 2, as shown by solid line 2. No local fluorine peak was observed at the interface of the tungsten silicide ($iWSi_x$) and the polysilicon layers for example 2. The fluorine concentration in the gate oxide is lowest for example 4 shown by dashed line 4. Example 3 is illustrated by the dotted line 3.

While the invention has been particularly shown and described with reference to the preferred embodiments thereof it will be understood by those skilled in the art that various changes in form and details may be made without departing from the spirit and scope of the invention.

What is claimed is:

1. The method of fabricating polycide gate structures without fluorine-induced degradation of the gate silicon oxide layer comprising:
   providing a gate polysilicon layer overlying said gate silicon oxide layer on the surface of a semiconductor substrate;
   depositing a thin conducting diffusion barrier layer having a thickness of between about 150 to 1500 Angstroms overlying said gate polysilicon layer;
   depositing a layer of tungsten silicide overlying said thin conducting diffusion barrier layer wherein a reaction gas used in said depositing of tungsten silicide contains fluorine atoms and wherein said fluorine atoms are incorporated into said layer of tungsten silicide;
   patterning said gate polysilicon, thin conducting diffusion barrier, and tungsten silicide layers to form said polycide gate structures; and
   annealing said substrate at a temperature of between about 800° to 1050° C. for between about 10 to 60 minutes to complete formation of said polycide gate structures wherein the number of said fluorine atoms from said tungsten silicide layer diffusing into said gate polysilicon layer are minimized by the presence of said thin conducting diffusion barrier layer and thereby said gate silicon oxide layer thickness is not increased.

2. The method of claim 1 wherein said thin conducting diffusion barrier layer is composed of titanium nitride.

3. The method of claim 1 wherein said thin conducting diffusion barrier layer is composed of tantalum nitride.

4. The method of claim 1 wherein said thin conducting diffusion barrier layer is composed of titanium/tungsten.

5. The method of fabricating polycide gate structures comprising:
   providing a gate polysilicon layer overlying a gate silicon oxide layer on the surface of a semiconductor substrate;
   depositing a thin conducting diffusion barrier layer having a thickness of between about 150 to 1500 Angstroms overlying said gate polysilicon layer;
   depositing a layer of tungsten silicide using a fluoride based deposition process overlying said thin conducting diffusion barrier layer;
   patterning said gate polysilicon, thin conducting diffusion barrier, and tungsten silicide layers to form said polycide gate structures; and
   annealing said substrate at a temperature of between about 800° to 1050° C. for between about 10 to 60 minutes to complete formation of said polycide gate structures.

6. The method of claim 5, wherein said thin conducting diffusion barrier layer is composed of titanium nitride.

7. The method of claim 5 wherein a fluorine-containing reaction gas used in said deposition of said tungsten silicide layer contains fluorine atoms which are incorporated into said tungsten silicide layer and wherein the number of said fluorine atoms from said tungsten silicide layer diffusing into said gate polysilicon layer are minimized by the presence of said thin conducting diffusion barrier layer and wherein because said diffusion of said fluorine atoms is minimized, said gate oxide layer thickness is not increased.

8. The method of claim 5 wherein said thin conducting diffusion barrier layer is composed of tantalum nitride.

9. The method of claim 5 wherein said thin conducting diffusion barrier layer is composed of titanium/tungsten.

* * * * *